United States Patent [19]

Boggio, Jr.

[11] Patent Number: 5,838,567
[45] Date of Patent: Nov. 17, 1998

[54] SYSTEM AND METHOD FOR INCREMENTAL FABRICATION OF CIRCUIT BOARDS

[75] Inventor: Robert F. Boggio, Jr., Loveland, Colo.

[73] Assignee: Hewlett-Packard Co., Palo Alto, Calif.

[21] Appl. No.: 677,989

[22] Filed: Jul. 10, 1996

Related U.S. Application Data

[63] Continuation of Ser. No. 235,435, Apr. 29, 1994, abandoned.

[51] Int. Cl.⁶ ........................................ G06F 19/00
[52] U.S. Cl. ........................... 364/468.28; 364/468.25; 364/491; 29/739
[58] Field of Search ............................ 364/468, 468.01, 364/468.02, 468.03, 468.04, 468.24, 468.25, 468.28, 488–491; 29/840, 564, 564.1, 573, 739–743, 703

[56] References Cited

U.S. PATENT DOCUMENTS

| | | | |
|---|---|---|---|
| 4,667,403 | 5/1987 | Edinger et al. | 29/840 |
| 4,706,187 | 11/1987 | Arai et al. | 364/468 |
| 4,811,480 | 3/1989 | Noble et al. | 29/809 |
| 4,965,927 | 10/1990 | Holzman | 29/740 |
| 5,170,554 | 12/1992 | Davis et al. | 364/468 |
| 5,325,582 | 7/1994 | Glaser et al. | 29/840 |
| 5,402,564 | 4/1995 | Tsukasaki et al. | 29/740 |

FOREIGN PATENT DOCUMENTS

W089/05567  6/1989  WIPO.

OTHER PUBLICATIONS

Von Günter Pritschow et al., *Modellierverfahren für die 3D–Simulation von NC–Bearbeitungen*, pp. 47–51, VDI–Z, vol. 135, Nr. 6, Jun. 1993.

Von Thomas Schätti, *Rapid Prototyping etabliert sich*, pp. 36–43, Technische Rundschau 20/91, 1991.

*Primary Examiner*—Reba I. Elmore
*Assistant Examiner*—Thomas E. Brown

[57] ABSTRACT

Circuit boards are fabricated in an incremental fashion. Conventional design data representing a layout of the circuit board is received. The design data is transformed into a three-dimensional matrix of increments (e.g., cubes) representing the circuit board, where each increment or cube within the matrix is identified by an address and is assigned a fabrication material. The circuit board is then built at a fabrication station by depositing the assigned fabrication materials onto a fabrication base in an incremental fashion as indicated by the matrix.

17 Claims, 15 Drawing Sheets

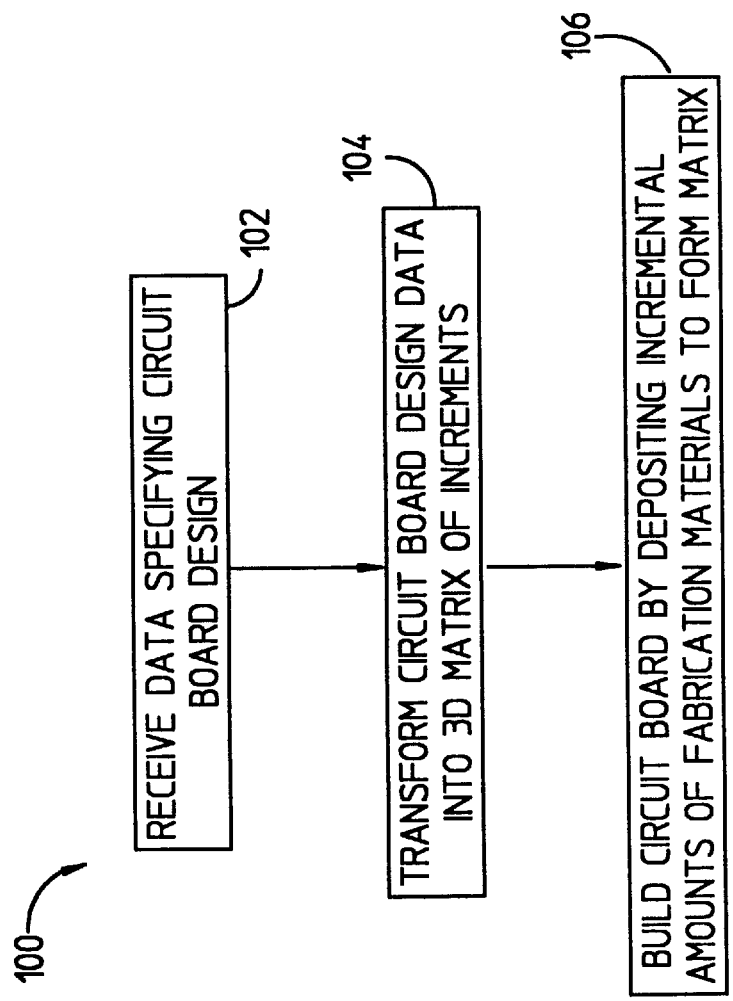

SYSTEM AND METHOD FOR INCREMENTAL FABRICATION OF CIRCUIT BOARDS

Cross Reference to Related Application(s)

This is a continuation of application Ser. No. 08/235,435 filed on Apr. 29, 1994, now abandoned.

BACKGROUND OF THE INVENTION

1. Field of the Invention

The invention relates generally to the manufacture of circuit boards, and more particularly, to a method and apparatus for fabricating circuit boards.

2. Related Art

The conventional printed circuit (PC) board includes a base or substrate material upon which and/or within which one or more layers of conductive features are bonded. Generally, the substrate material is FR-4 (a fire-resistant, epoxy-bonded fiberglass). The conductive traces are generally formed from copper ("one ounce" or 0.0014 inch thickness is standard). In its double sided PTH (plated through hole) implementation, the PC board includes a substrate having a single layer of conductive traces deposited each of its two major faces (i.e., top and bottom). The electronic components are mounted on one side of the circuit board. Holes, drilled through the substrate and conductive layers, allow leads of components to be passed through the PC board from a first side (e.g., top) of the board and soldered to pads and conductive traces on a second side (e.g., bottom) of the board. The conductive traces make the appropriate interconnections between the electronic components.

For complex circuits, laminated, multi-layer PC boards are used. In a multi-layer PC board, one or more inner conductive layers are sandwiched between layers of substrate material. The inner layers often include power and ground planes and sometimes signal planes as well. Four and six layer boards are routinely used, and very complex PC boards may include as many as forty layers. Multi-layer PC boards, in general, also have conductive outer layers.

The conventional PC board fabrication technique takes a sheet-based approach. Whenever a conductive layer of material is desired to be included on or in a board, an entire sheet of the material is bonded into the board. For example, if a two-sided board is desired, then a conductive layer of copper is bonded to each side of a substrate. The desired interconnect features are formed in the copper layers by etching.

For ease of discussion, the conventional manufacturing process is described with reference to a two-sided PTH board. To fabricate a two-sided board, a manufacturer will often start with an FR-4 substrate having a sheet of copper foil or cladding on each side. The PC board designer then provides the manufacturer with electronic data describing the conductive traces and contacts to be formed on each side of the board along with a list of X–Y coordinates indicating the positions where holes must be drilled in the PC board. The manufacturer creates the necessary fabrication tools including drill and router programs and image transfer film using CAD/CAM computer systems and a photo plotter or laser plotter, respectively.

Fabrication begins by drilling holes in the PC board at the locations indicated by the X–Y coordinates. This is performed using a computer controlled machine. A hole is drilled wherever a connection must be made between the two sides of the board or wherever a hole is required for mounting an electronic component. Once the holes are drilled, they must be plated through. Plating involves creating a conductive coating through the inner bore of the hole to electrically connect a pad on one side of the board to a pad on the other side of the board.

Plated through holes (PTHs) are produced in a series of complex chemical processes starting with electroless copper deposition. In this process, involving up to ten chemical steps, the dielectric material in each hole is treated with a thin layer of copper. The copper deposition is on the order of 0.1 mils thick for "heavy" deposition processes and on the order of 0.025 mils thick for "thin" deposition processes.

Once the plated through holes have been made electrically conductive, the PC board is processed through outer layer image transfer to define the desired features on the copper layers. This process proceeds as follows. First, a photo-resist material is applied to each side of the PC board to cover the copper foil. The photo-resist material is sensitive to ultra-violet (UV) light of a certain wavelength. A phototool or mask (e.g., a silver or diazo-based film) carrying a schematic of the desired trace patterns is then used as a template or mask to expose portions of the photo-resist material to the UV light. The UV light causes the exposed portions of the photo-resist material to polymerize.

Next, the board is chemically developed to remove the unpolymerized (unexposed) portions of the photo-resist which are soluble in a developing solution. The polymerized (exposed) portions of the photo-resist will remain on the copper surface in a pattern dictated by the phototool. The conductive features on the board are defined by the thickness of the photo-resist and the pattern provided by the phototool. The photo-resist covered portions of the copper foil are the portions which will ultimately be removed to leave the desired conductive trace pattern.

After chemical developing of the photo-resist, the PC board is emersed in a series of chemistries, some of which are of the electroplating type. This results in the plating of one or metals (typically copper followed by tin/lead or nickel/gold) onto the exposed portions of the copper foil and onto the inner bores of the PTHs. The portions of the copper foil covered with the photo-resist material will not be plated.

Having completed its task, the photo-resist material is chemically removed to expose the unwanted portions of the copper foil. These unwanted portions are removed with a copper-etching chemistry. The secondary electroplated metal (tin or nickel) functions as an etch resist to prevent removal of the plated features when the unwanted portions of the copper foil are chemically removed. The remaining electroplated copper foil will bear the desired pattern of plated traces and through holes.

In a final step, a coating of non-conductive "soldermask" is applied to both sides of the PC board to protect the newly formed traces from being inadvertently damaged or shorted together during assembly of components onto the new PC board. The pad areas which are to make contact with the electronic components are not covered with soldermask.

This intricate process of manufacturing a two-sided printed circuit board is vastly complicated for multi-layer PC boards. The process is time and labor intensive. In addition, large quantities of chemicals are produced which must be disposed of as hazardous waste. Other wastes include the costly copper which is etched away from the printed circuit board. Moreover, the yields of conventional printed circuit board fabrication techniques are generally less than 95% on average.

Other important challenges are facing the printed circuit board manufacturing industry. For example, as the density of electronic circuits continues to increase, PC board features (e.g., traces, vias, plated through holes, pads and the like) must decrease in size. This poses a significant problem in PC board fabrication. In creating a plated through hole, the corresponding feature of each conductive layer which is to be connected must be precisely aligned. Further, the drilled hole must be precisely located. As the dimensions of the plated through holes and traces are decreased, this alignment becomes increasingly difficult. Tolerances in the fabrication process are the primary cause of difficulty. However, temperature variations and material shrinkage add to the problem. These difficulties tend to limit the densities with which PC boards can be cost effectively manufactured.

Automation is improving productivity in the manufacture of PC boards at an evolutionary pace. However, the number of skilled workers required in a fabrication operation remains quite high. Moreover, advances in the art of PC board fabrication have tended to be mere refinements of an essentially tedious and resource wasteful process.

What is needed is a method and apparatus for fabricating printed circuit boards which overcomes the limitations of the prior art and provides a mechanism for cost effectively meeting the high density, ultra-fine feature requirements of future PC boards.

SUMMARY OF THE INVENTION

The present invention is directed to a system and method for incremental fabrication of circuit boards using micro-manufacturing techniques and the principles of nanotechnology. The invention is a computer-based method and apparatus for fabricating a circuit board. The invention departs from conventional printed circuit board manufacturing techniques and fabricates a circuit board in an incremental fashion. The method of the invention involves receiving design data representing a layout of the circuit board; transforming the design data into a three-dimensional matrix of increments (e.g., cubes) representing the circuit board, where each increment or cube within the matrix is identified by an address and is assigned a fabrication material; and building the circuit board at a fabrication station by depositing the assigned fabrication materials onto a fabrication base or work surface in an incremental fashion as indicated by the matrix.

Transforming the conventional design data into a three-dimensional matrix of increments involves the following steps. First, an increment size is calculated based on the design features of the circuit board. In the preferred embodiment, the increment size is selected to be one-tenth the size of the smallest feature (e.g., the minimum trace width) on the circuit board. A generic matrix of increments which approximately represents the physical dimensions of the circuit board is then generated. Increments are removed from the generic matrix to form cut-out features of the circuit board. Similarly, increments are added to selected locations of the generic matrix to form features which protrude outward from the surfaces of the circuit board. Finally, a fabrication material and an address are assigned to each increment in the generic matrix.

The step of depositing the fabrication materials on the fabrication base to build the circuit board, includes the following steps. First, an applicator assembly is positioned at a starting position above the fabrication base. The starting position corresponds to an address of a first increment in a first layer or slice of the matrix representing the circuit board. A fabrication material assigned to the first increment is then deposited on the fabrication base at a position corresponding to the address of the first increment. Next, the applicator assembly is positioned to a next position corresponding to an address of a next adjacent increment in the matrix. A fabrication material assigned to the adjacent increment is then deposited on the fabrication base at the position corresponding to the address of the adjacent increment. These steps are then repeated until an entire layer of the circuit board has been formed by depositing the increments representing the first layer of the matrix.

Once a layer or slice of the circuit board is completed, the applicator assembly is moved up and the deposition of increments for the next layer is commenced. This process is repeated until each layer of the matrix has been created to form the completed circuit board. It should be understood that the term "layer" as used herein when referring to the invention does not refer to a layer in the conventional sense of a printed circuit board which is fabricated using a layering process. Rather, the term layer refers to a number of increments deposited in rows and columns to form a slice of the circuit board in the x,y plane.

The system of the invention includes a transformation means, such as a general purpose computer, and a fabrication station. The transformation means receives data specifying design requirements of the circuit board and generates a three-dimensional matrix of increments representing the circuit board. The fabrication station includes at least one fabrication cabinet, a nitrogen supply system and a fabrication controller. Each fabrication cabinet builds circuit boards under control and supervision of the fabrication controller. The nitrogen supply system provides liquid nitrogen to the fabrication cabinet for cooling, to provide a non-oxidizing fabrication environment and to be used as a fabrication material.

Each fabrication cabinet includes a raw material supply region, a fabrication region and an output region. The raw material supply region receives raw fabrication materials, stores them in a raw material queue, and provides them to the fabrication region as required. The fabrication region includes a fabrication base, an applicator assembly, a position system and a material delivery support system. The applicator assembly deposits increments of molten or liquid raw material onto the fabrication base to build a circuit board. The positioning system provides relative positioning of the applicator assembly with respect to the fabrication base as the circuit board is incrementally fabricated. The material delivery support system delivers raw material from the raw material queue to the applicator assembly.

The fabrication region is sealable with respect to the other regions of the fabrication cabinet. During circuit board fabrication, the fabrication regions is purged of all air and is filled with nitrogen from the nitrogen supply subsystem. This provides a cooled, non-oxidizing environment for the circuit board fabrication.

The output region of the fabrication cabinet includes a shuttle assembly, an accumulator and an elevator. The shuttle assembly is configured to remove completed circuit boards from the fabrication region and to deliver them to the accumulator. The accumulator collects the completed circuit boards and provides them to the elevator assembly in a first-in, first-out basis. The elevator assembly then removes each completed circuit board from the fabrication cabinet.

The present invention revolutionizes the way circuit boards are presently fabricated. The term "printed circuit board" is not applicable to circuit boards fabricated in accordance with the invention since no printing occurs. The applicator assembly deposits very small volumes (e.g., 0.010 cubic inches or less) of conductive, dielectric and/or null material in a three-dimensional array of incremental "cubes " (cubes are used for discussion/purposes only, actual shape may vary). After each incremental volume or increment of material is deposited, the applicator assembly is moved in an x or y direction to the next adjacent cube. The applicator assembly continues depositing material until the plane is complete. Then, the applicator assembly is incremented one position in the z direction (the vertical direction), and the depositing of material in the next horizontal plane is continued. The process of scanning (and depositing material) and incrementing in the z direction continues until the circuit board is complete.

Using conventional fabrication processes, a multilayer printed circuit board requires approximately 48 to 60 hours to fabricate. In contrast, it is anticipated that the present invention can build a circuit board in approximately four hours.

Another advantage of the present invention is a dramatic reduction in the amount of fabrication materials required. Because materials are not added in sheet form with unwanted portions being chemically or mechanically removed, raw materials are conserved. Only the precise amounts of raw materials actually required are used.

Yet another advantage of the present invention is a dramatic reduction in the types of process chemicals required. For example, no etching or cleaning chemicals (e.g., solvents and acids) are required. Not only does this directly reduce raw material costs, it also substantially eliminates hazardous waste production.

Still another advantage of the present invention is that the manufacturing process is greatly simplified which results in a reduction in the number of people required to fabricate a circuit board.

Another advantage of the incremental circuit fabrication technique of the invention is that circuit boards may be manufactured with feature sizes, densities and complexities which are not possible using conventional fabrication techniques.

Further features and advantages of the present invention, as well as the structure and operation of various embodiments of the present invention, are described in detail below with reference to the accompanying drawings.

BRIEF DESCRIPTION OF THE DRAWINGS

FIG. 1A is high-level flow chart illustrating the method of the invention for fabricating a circuit board.

Figure 1B:
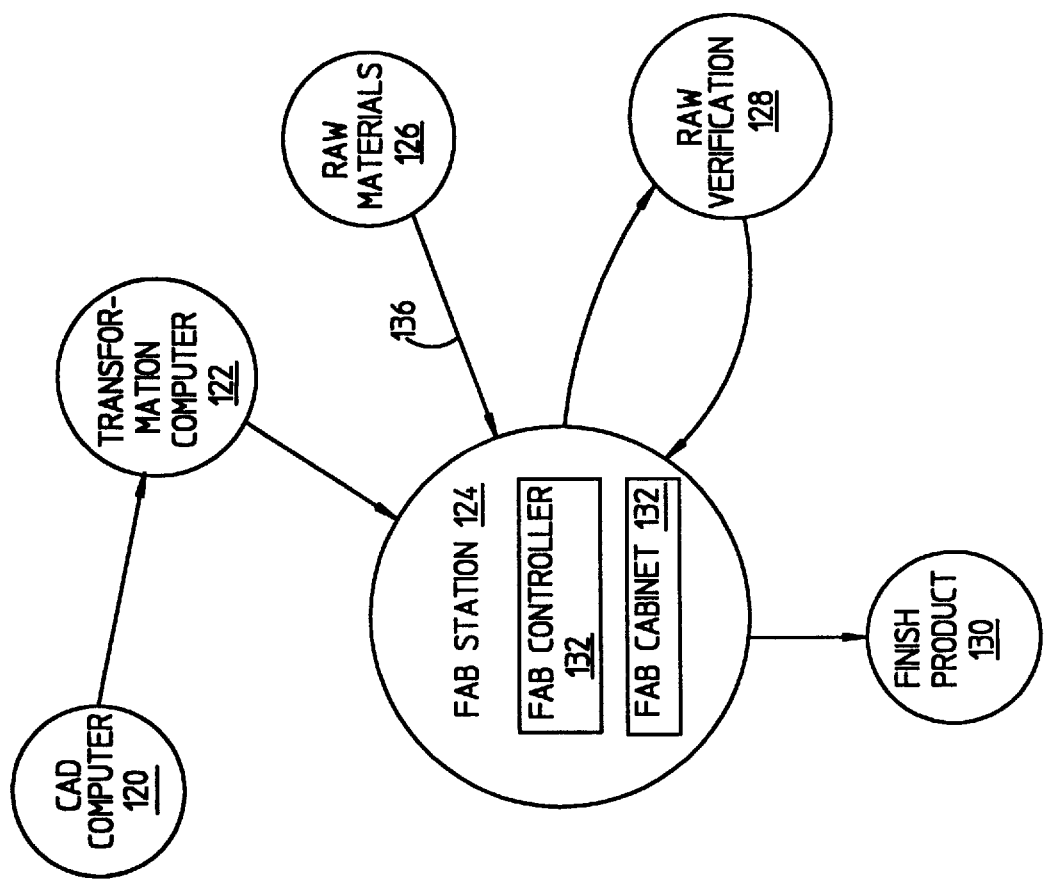
FIG. 1B is an operational flow diagram showing the interaction of unit operations in accordance with the present invention.

DETAILED DESCRIPTION OF THE
PREFERRED EMBODIMENTS

The invention is a method of fabricating circuit boards which departs from conventional printed circuit board manufacturing techniques. In accordance with the invention, a circuit board is built in an incremental or piece-by-piece fashion. The presently preferred embodiment of the invention is presented in detail below. While specific configurations and arrangements are discussed, it should be understood that this is done for illustration purposes only. A person skilled in the art will recognize that other configurations and arrangements may be used without departing from the spirit and scope of this pioneering invention.

The preferred embodiment of the invention is described with reference to the figures where like reference numbers indicate like elements. Also in the figures, the left most digit of each reference number corresponds to the figure in which the reference number is first used.

FIG. 1A is a high level flow chart illustrating the method 100 of fabricating a circuit board in accordance with the invention. In a step 102, conventional design data (i.e., circuit layout, interconnections and board dimensions) for the circuit board is received from a board designer. In a step 104, the design data is transformed into a three-dimensional matrix of increments (e.g., cubes) representing the circuit board. Each increment is assigned a fabrication material. In a step 106, the circuit board is fabricated by depositing incremental amounts of the fabrication materials to form the matrix representation of the circuit board. A circuit board formed in this manner is precisely built without wasted materials and without the large number of complicated processing steps found in conventional techniques.

The design data received in step 102 is generally created using conventional Computer Aided Design (CAD) and other software tools on a general purpose computer (referred to herein as "the CAD computer"). The design data includes x and y (cartesian coordinate) locations and routing for the circuit features of each layer of the board as well as the size, number and x,y locations of all interconnections (through holes, blind or buried vias, vias, etc.) between the layers. The design data also specifies materials of construction, number of layers and overall physical dimensions and shape of the board. Additionally, a "design class" may be specified for each circuit board. A design class is an administrative designator used to categorize a circuit board's complexity, usually its smallest trace and space feature. For example, a design class of PC 5 equals a minimum trace width of 5 mils and a minimum space between the most densely routed traces of 5 mils. A design class of PC 4/6 equals a minimum of 4 mil wide traces with 6 mil minimum spacing. Other attributes such as finished hole size may also be implied by the design class, but this will vary depending on the particular board designer and/or fabrication process.

FIG. 1B is an operational flow diagram showing the interaction of unit operations in accordance with the present invention. Design information and part characteristics are created by a circuit board designer on a CAD computer 120. This data is transferred to a general purpose or transformation computer 122, preferably at the fabrication location. The transfer may take place electronically (e.g., via modem or network communications) or physically by transferring a disk, tape or other data storage medium between the two systems. Computer 122 transforms the data into a three dimensional matrix as described above and assigns a fabrication material to each matrix address.

Computer 122 transfers the transformed data to a fabrication station 124. Fabrication station 124 then fabricates a circuit board in accordance with the transformed or three-dimensional matrix data. Fabrication station 124 includes a fabrication controller 134 (i.e., a computer) and one or more fabrication cabinets 132. Each fabrication cabinet 132 builds circuit boards under control of fabrication controller 134 based on the three-dimensional matrix. Raw fabrication materials 126 are provided to fabrication cabinets 132 by a raw material supply system 136. Completed circuit boards are output from fabrication station 124 as indicated at block 130.

Fabrication controller 134 controls and monitors the building of each circuit board. The monitoring of the building process is indicated by process verification block 128. Process verification occurs in real-time by comparing the material prescribed/declared (in the matrix data) for each increment to what is actually deposited to the increment address. Process verification is accomplished by electronically comparing (via software in fabrication controller 134) the signature characteristics of each increment of material actually delivered to the material specified. The signature characteristics of the deposited material are identified by suitable sensors within fabrication cabinet 132 which monitor the circuit board fabrication process.

Incremental deliveries which are declared to be incorrect (e.g., wrong material, too much material or too little material) are recorded in a fault file and compared to predetermined acceptability limits. If the deliveries recorded in the fault file exceed the predetermined acceptability limits, then the end product is declared defective and is marked before being transferred out of fabrication station 124.

Figure 2:
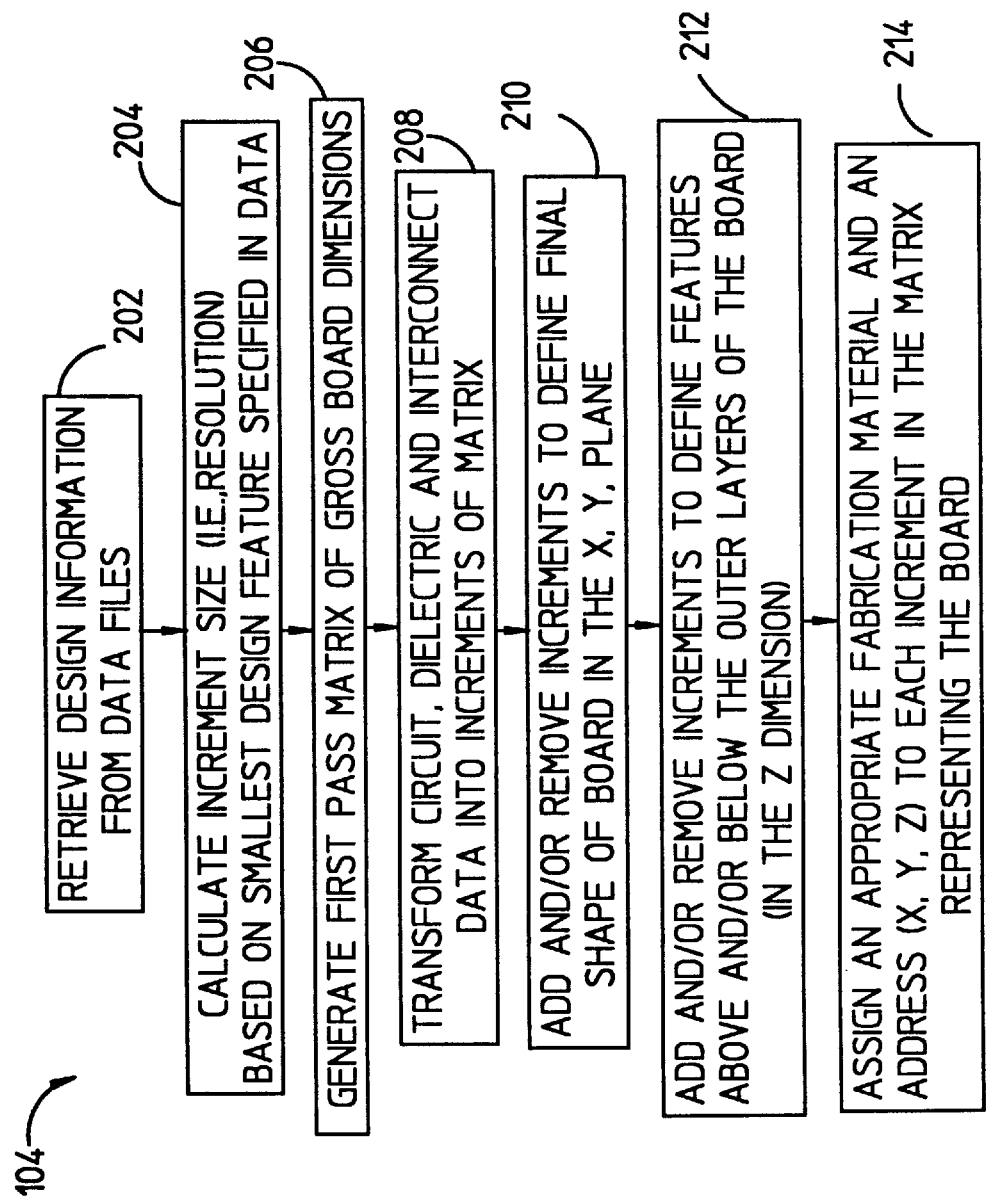
FIG. 2 is a flow chart detailing step 104 of FIG. 1A of transforming a conventional circuit board design into a three dimensional matrix of increments.

FIG. 2 is a flowchart detailing step 104 of transforming a circuit board design into a three-dimensional matrix of increments. This step of transforming will generally be performed on a general purpose computer such as transformation computer 122 near the fabrication site. In a step 202, pertinent design information is retrieved from the conventional circuit board design data files received in step 102 at FIG. 1A. In step 204, an increment size is calculated. The increment size or resolution is based on the smallest design feature specified in the design data retrieved in step 202. Each increment represents a small portion of the circuit board. The increment size is chosen to be small enough so that the smallest features of the circuit board will be represented by increments of homogenous material. For example, a 1 mil thick by 5 mil wide copper trace can be represented as five 1 mil increments stacked side by side.

It is preferred that an increment size be selected as one tenth the minimum trace width of the circuit board. Thus, for minimum trace widths in the range of 0.1 to 15 mils, increment sizes may be selected in the range of 0.01 to 1.5 mils (per side for a cube), respectively. This factor of ten difference between minimum trace width and increment size represents a reasonable tradeoff between fabrication resolution and fabrication time.

In a step 206, a first pass or generic matrix representing the gross dimensions of the circuit board is generated. The first pass matrix is a matrix of increments, such as cubes, which roughly represents the physical dimensions of the circuit boards as specified in the design data from step 202. In a step 208, the electrical circuit information, the dielectric information and the electrical interconnect information from step 202 are transformed or mapped into the matrix of increments. After step 208, each increment of the matrix will correspond to a particular feature of the circuit board to be built. This includes any protective coatings (such as a dielectric to replace the conventional solder mask) on the surfaces of the output layers of the circuit board.

Steps 210 and 212 refine the first pass matrix of gross board dimensions from step 206. Specifically, in step 210, increments are added to or removed from the first pass matrix to define the final shape of the circuit board in the x,y plane. In step 212, increments are added and/or removed from the matrix to define features above and/or below the outer layers of the circuit board in the z dimension. Finally, at step 214, an appropriate fabrication material and an address is assigned to each increment in the matrix. This step completes transformation of the conventional circuit board design data into a three-dimensional matrix of increments.

Note that the absence of a material (e.g., the space or void in a through hole or a cutout or missing area that traverses all of the increments in the z direction) is represented with a null material. In the preferred embodiment, the null material is liquid nitrogen. Also note that other interconnect features such as vias that have conventionally been implemented using a drilling and plating process are now implemented as solid conductive columns (in the z direction).

Figure 3:
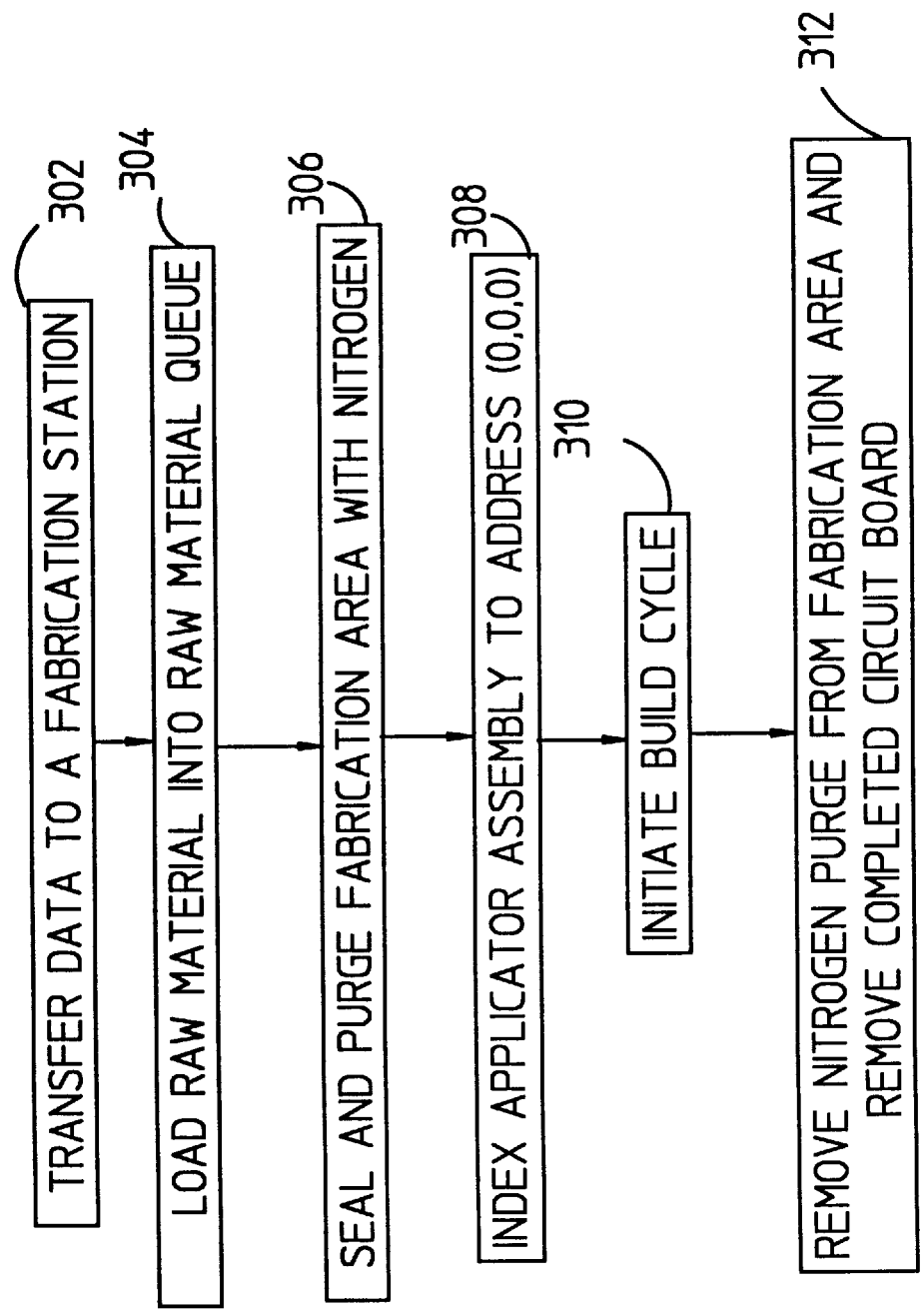
FIG. 3 is a flow chart detailing step 106 of FIG. 1A of building a circuit board.

FIG. 3 is a flowchart detailing step 106 of FIG. 1A. In a step 302, the three-dimensional matrix data for the circuit board design is transferred from general purpose computer 122 on which the transformation took place to the fabrication controller 134 of a fabrication station 124. In a step 304, the raw material required to fabricate the board is robotically loaded into a raw material queue (described below). In a step 306, a fabrication area is sealed from the surrounding atmosphere and is purged and filled with a refrigerated nitrogen gas. The nitrogen gas provides a non-oxidizing environment for fabrication of the circuit board.

In a step 308, an applicator assembly (described below) is indexed to a home address (e.g., 0,0,0). A circuit board build or fabrication cycle is then initiated in a step 310. The build cycle involves cycling the applicator assembly through each address of the matrix and depositing an appropriate fabrication material at each address. Finally, at step 312, the fabrication area is opened and a completed circuit board is removed.

Figure 4:
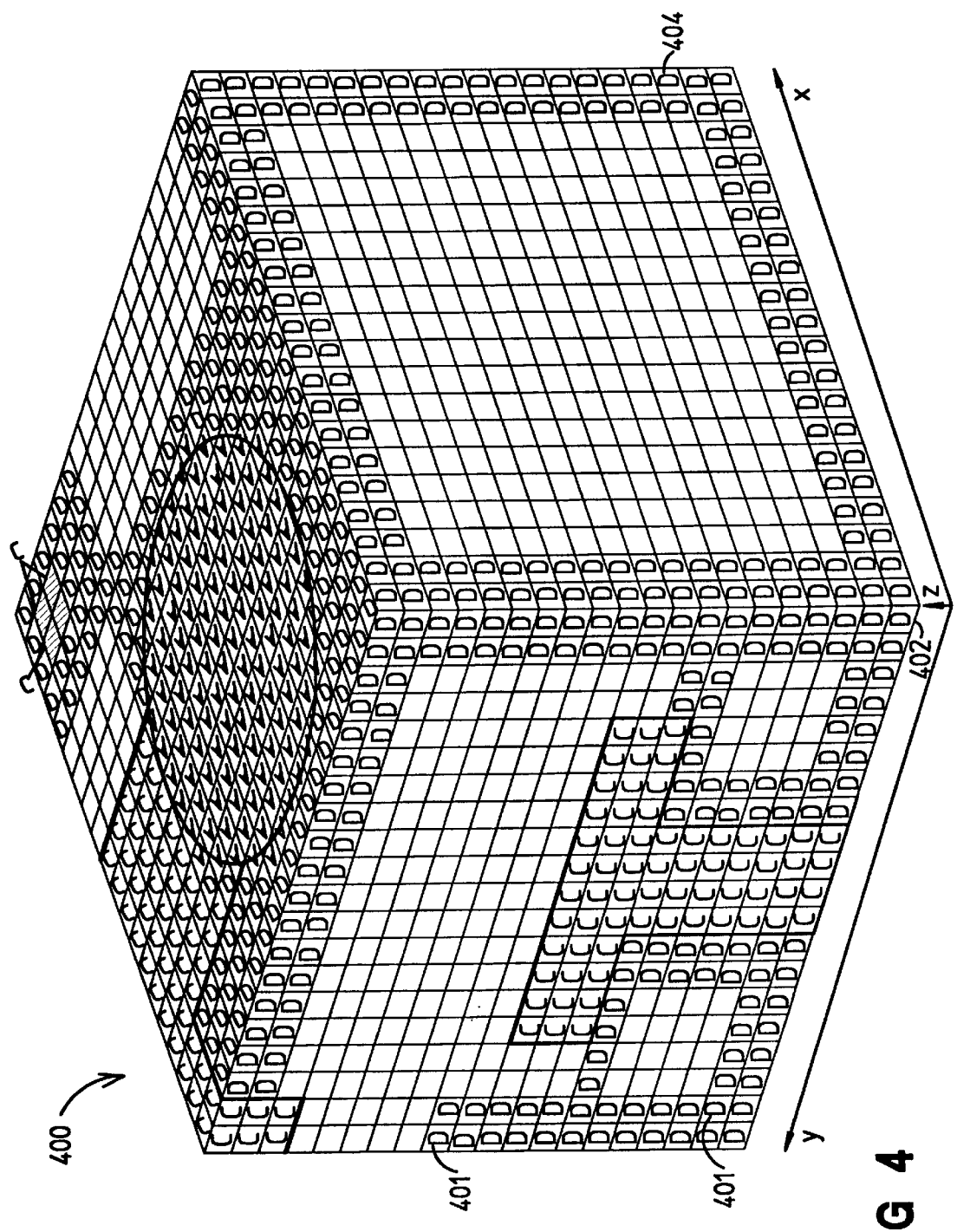
FIG. 4 illustrates an example of a three dimensional matrix of increments.

FIG. 4 illustrates an example of a three dimensional matrix 400 of increments 401. Increments 401 are shown as cubes for illustration purposes, however, increments 401 may assume other shapes (e.g., blobs or spheres of material). When continued to the full extent of a design, the three-dimensional matrix 400 forms a circuit board. Each cube 401 is assigned a coordinate address. For example, a cube 402 is assigned address location 0,0,0 (corresponding to the origin of the Cartesian coordinate system), and cube 404 is assigned address location (19,0,2).

Fabrication material assignments are made after the total number of increments have been calculated. In the preferred embodiment, there are four primary materials used in fabricating the circuit board. These include dielectric (d); conductor (c); void, null or none (v); and conductive adhesive (a). The conductive adhesive may be used to assure adhesion between the conductor and dielectric materials which may not readily adhere to one another. A through hole is formed by assigning a void material (v) to the appropriate increments in the matrix. A fabrication material and an address are assigned to each increment in the matrix. When completed, each cube 401 is represented by an address (x,y,z) followed by a fabrication material identifier. For example, cube 402 may be represented as (0,0,0,d).

Figure 5:
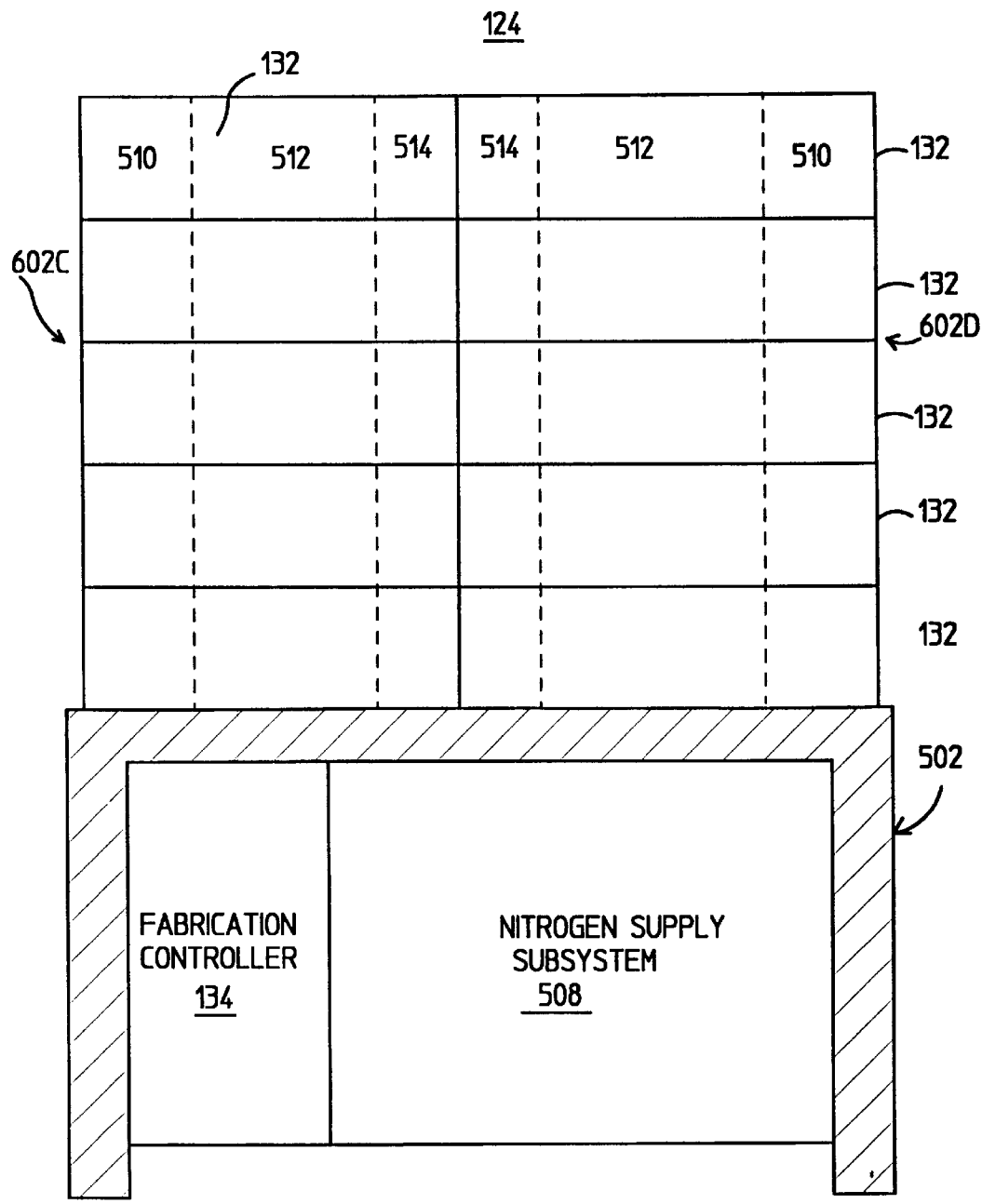
FIG. 5 is a front view of a fabrication station of the invention.
Figure 6:
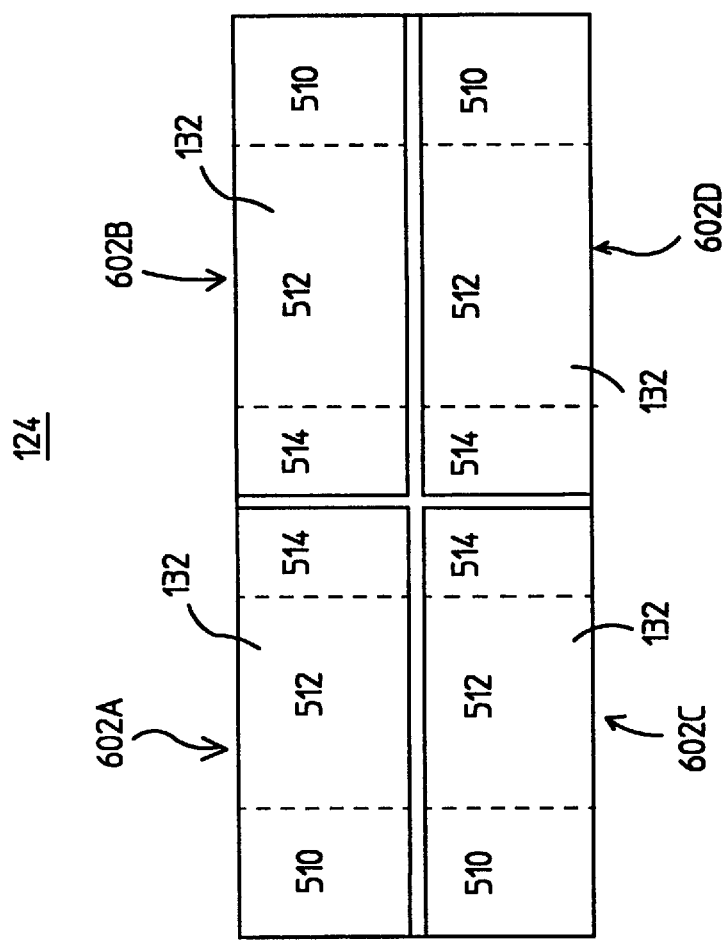
FIG. 6 is a top view of the fabrication station of FIG. 5.

FIG. 5 is a front view and FIG. 6 is a top view of a fabrication station 124. Fabrication station 124 includes four fabrication modules 602A–602D resting atop a frame or housing 502. Each fabrication module 602 includes a number (e.g., five are illustrated) of fabrication cabinets 132 arranged in a vertical stack. Thus, in the illustrated embodiment, fabrication station 124 includes twenty fabrication cabinets 132.

Each fabrication cabinet 132 of fabrication station 124 is configured to fabricate circuit boards in accordance with the invention. A number of fabrication cabinets are grouped together into a fabrication station so that common resources may be shared between the cabinets. These common resources include fabrication controller 134 and a nitrogen supply subsystem 508. The fabrication controller 134 and nitrogen subsystem 508 are housed within housing 502 as illustrated in FIG. 5.

Each fabrication cabinet 132 includes a raw material supply region 510, a fabrication region 512, and an output region 514. The raw material supply regions 510 of all cabinets 132 in a fabrication module or stack 602 (e.g., five cabinets in the illustrated embodiment) are linked together to share resources (as described in greater detail below). Resources may also be shared between raw material supply regions of adjacent fabrication modules or stacks 602 (e.g., between modules 602A and 602C or between modules 602B and 602D). This however is not required.

Output regions 514 of all cabinets 132 in a stack 602 share a common elevator assembly (described below) for the delivery of completed circuit boards from the fabrication cabinets 132.

Each fabrication cabinet 132 builds circuit boards under the control and direction of fabrication controller 134. When either nitrogen gas or liquid nitrogen is required in the fabrication process, it is supplied to a fabrication cabinet 132 by nitrogen supply subsystem 508.

Figure 7:
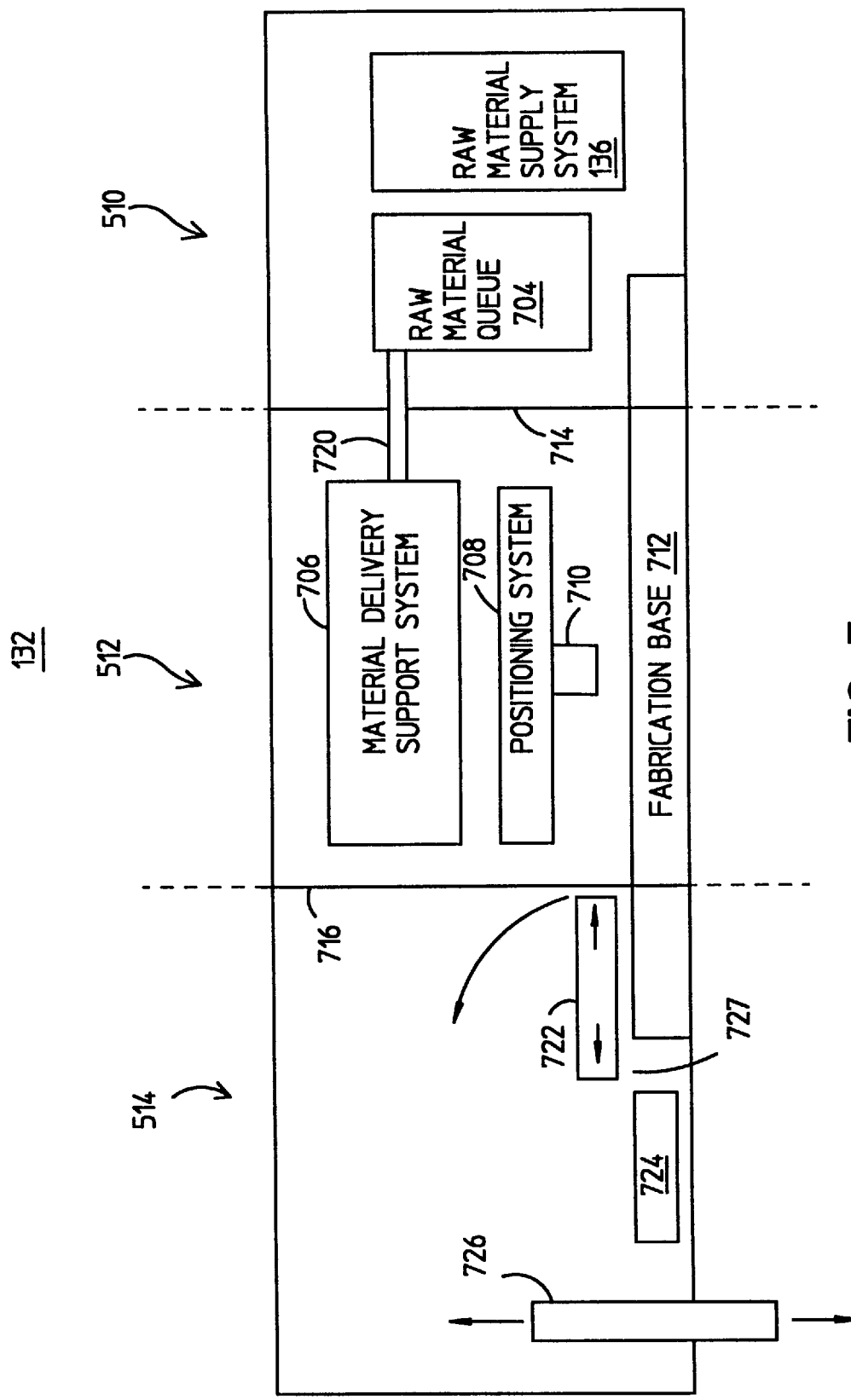
FIG. 7 is a simplified block diagram of a side view of a fabrication cabinet in accordance with the invention.

A fabrication cabinet 132 is now described in detail with reference to FIGS. 7 and 8. Referring first to FIG. 7, the three regions 510, 512 and 514 of a cabinet 132 are illustrated. Raw material supply region 510 includes a raw material supply system 136 and a raw material queue 704. Fabrication region 512 includes a material delivery support system 706, an applicator positioning system 708, an applicator assembly 710 and a fabrication base 712. Output region 514 includes a shuttle assembly 722, an accumulator 724 and an elevator assembly 726.

With the exception of a guide tunnel 720, fabrication region 512 is sealed from raw material supply region 510 by wall 714. Fabrication region 512 is sealed from output region 514 by wall 716. Guide tunnel 720 allows raw material queue 704 to deliver raw material to material delivery support system 706 without substantially violating the sealed integrity of wall 714.

Fabrication cabinet 132 operates as follows. Raw material supply system 136 services a number of cabinets 132 (as discussed above). Raw material supply system 136 supplies raw materials such as conductive material and insulating material to raw material queue 704 in the form of wire (or ribbon). Raw material queue 704 stores the materials to be used in fabricating the specified circuit boards based on instructions from controller 134. Raw material queue 704 then supplies the raw materials to material delivery support system 706 through guide tunnel 720. Guide tunnel 720 allows the raw materials to be delivered to material delivery support system 706 without violating the sealed integrity of wall 714. This allows a nitrogen environment to be maintained within fabrication region 512.

Material delivery support system 706 delivers the raw materials to applicator assembly 710. Material delivery support system 706 maintains a proper tension on each of the wires or ribbons of raw material and allows enough slack for free movement of applicator assembly 710 above fabrication base 712. Positioning system 708 is configured to move applicator assembly 710 in the x, y, and z dimensions.

Applicator assembly 710 applies the raw materials to fabrication base 712 in a molten form. The nitrogen environment maintained within fabrication region 512 prevents oxidation during the fabrication process. In addition, the nitrogen provides cooling to fabrication region 512. By scanning applicator assembly 710 in an x direction, a row of raw material increments may be deposited on fabrication base 712. Then, by incrementing the y position of applicator assembly 710, the next row may be scanned. Once an x,y slice or layer of the circuit board is complete, positioning system 708 can be moved one step in the z direction and increments may be deposited to form the next x,y slice or layer of the circuit board.

Once fabrication of the circuit board is complete, wall 716 may be opened to allow shuttle assembly 722 to remove the completed circuit board from fabrication region 512. Shuttle assembly 722 is configured to move in a horizontal direction to enter fabrication region 512. Shuttle assembly 722 then grasps the circuit board in a robotic fashion and transfers the circuit board into output region 514. Shuttle assembly 722 is also configured to pivot about point 727 to lift the printed circuit board into a vertical orientation. The circuit board may then be placed into accumulator 724.

Accumulator 724 is a first-in, first-out (FIFO) device having a slotted frame configured to hold a plurality of circuit boards. Accumulator 724 is also configured to deliver a circuit board to elevator assembly 726 for removal from cabinet 132. As discussed above, elevator assembly 726 is shared by a number of fabrication cabinets 132.

Figure 8:
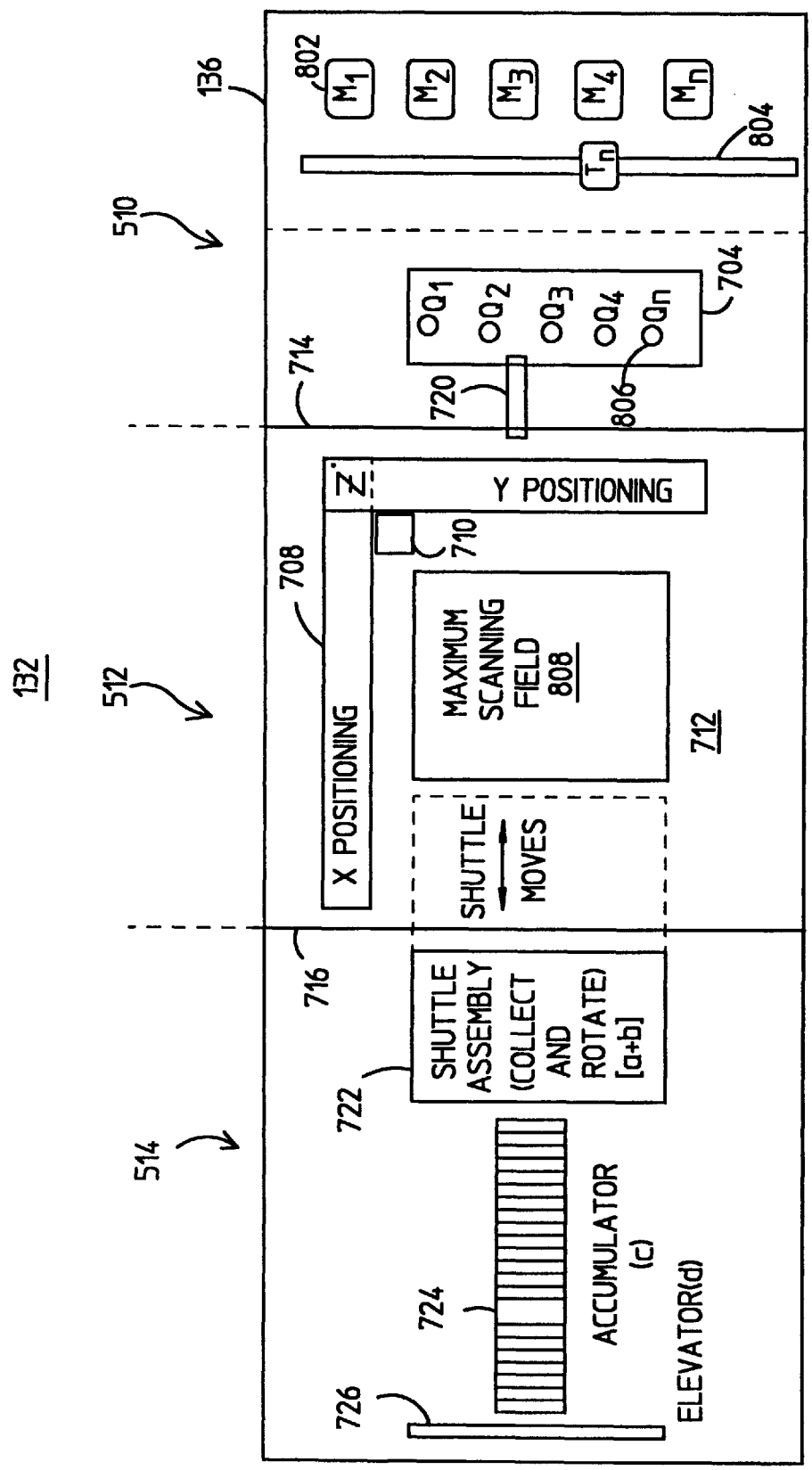
FIG. 8 is a simplified block diagram of a top view of the fabrication cabinet of FIG. 7.

FIG. 8 is a top view of fabrication cabinet 132. Raw material supply system 136 is illustrated as a number of spools 802 of raw materials M and a robotic threading assembly 804. Robotic threading assembly 804 is configured to withdraw a wire (or ribbon) of raw material from one of spools 802 and to deliver it to raw material queue 704. Raw material queue 704 includes a number of queue spools $Q_n$. Robotic threading assembly 804 includes a means for delivering a predetermined length of material to a queue spool 806. Robotic threading assembly 804 is also configured to thread an end of each wire or ribbon into transfer tunnel 720. Robotic threading assembly 804 may be implemented using known robotic techniques.

Material delivery support system 706 (not shown in FIG. 8) is configured to receive the wire or ribbon stock of raw materials from transfer tunnel 720 and to provide the raw material to applicator assembly 710. Positioning system 708 may then scan applicator assembly 710 over fabrication base 712. Fabrication base 712 defines a maximum scanning field 808. The maximum scanning field 808 is the specified working area for the depositing of increments of raw material by applicator assembly 710.

Applicator assembly 710 is configured to receive the raw materials in the form of wire or ribbon stock and to apply the raw materials in a molten form as increments upon fabrication base 712. In addition to the basic four materials of dielectrics (e.g., silicone polymers, epoxies or other engineered plastics), conductors (e.g., copper, nickel, tin, aluminum, gold and designer alloys), conductive adhesives and null materials (e.g., liquid nitrogen), other fabrication materials may be used. For example, the fabrication materials may also include solder, solder paste and semiconductor materials such as silicon or germanium. Solder paste may be applied to the outer surfaces of the circuit board in preparation for the mounting of components thereon. The application of solder paste in this manner may be used to replace the conventional practice of "hot air leveling" a circuit board.

A plurality of material applicators (described below) are provided in the applicator assembly 710 to handle these variety of materials. Each material applicator will be dedicated to a single material.

Figure 9:
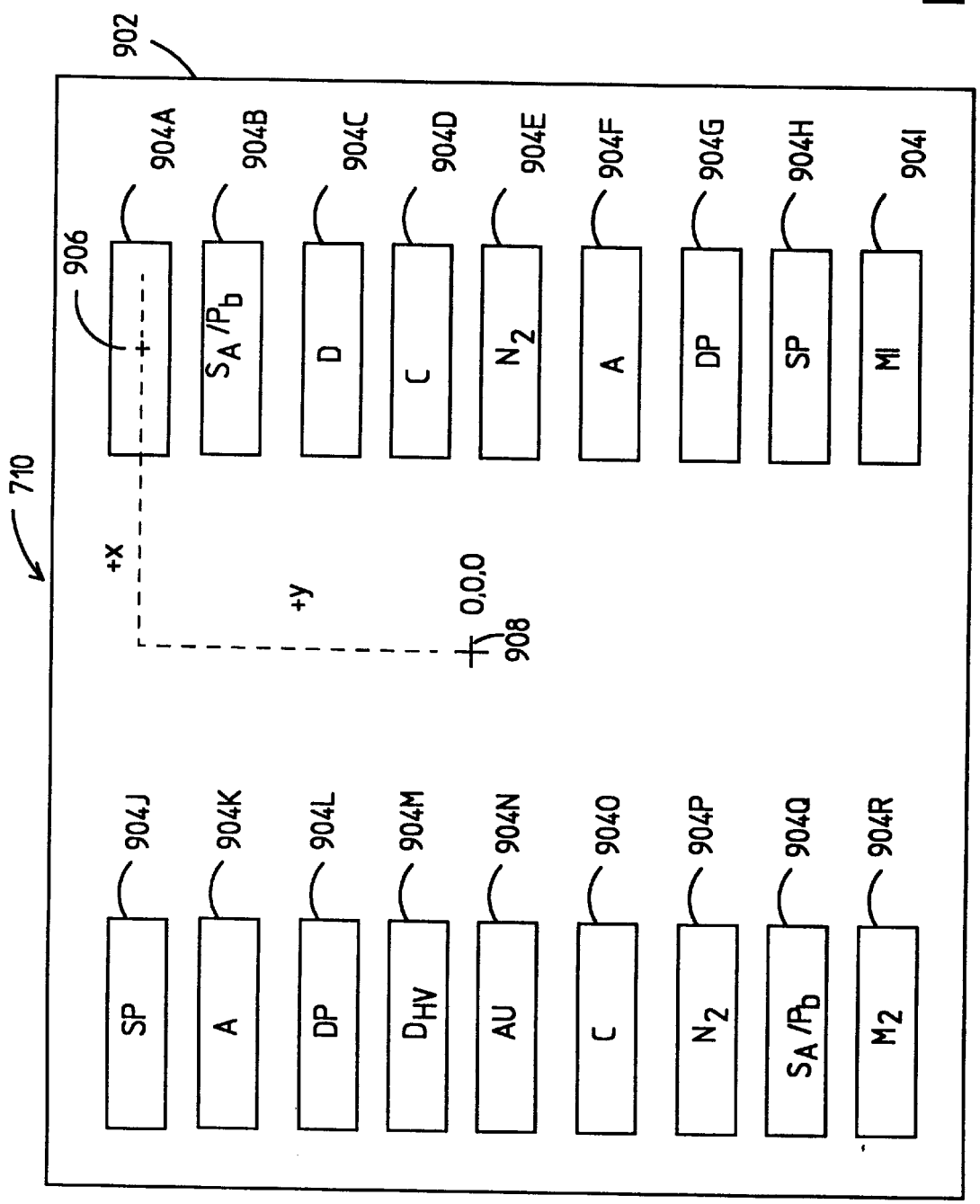
FIG. 9 is a top view of an applicator assembly of the invention.

FIG. 9 is a top view of applicator assembly 710. Applicator assembly 710 includes a deposit head 902 and a plurality of material applicators 904. Deposit head 902 is a plate having a plurality of openings therein. Each opening accommodates a snout (described below) of a material applicator 904. Each material applicator 904 is configured to deposit its material when instructed to do so by fabrication controller 134. For example, applicator assembly 710 will be moved relative to matrix 400 so that a selected material applicator 904 is above an address of matrix 400 where the material deposit is desired. This relative positioning includes moving applicator assembly 710 such that the center of a selected material applicator 904 is centered on the desired matrix address. This involves compensating for the known center 908 of deposit head 902 and the center position 906 of, for example, material applicator 904A.

Some of the plurality of material applicators 904 provided on deposits 902 are redundant. For example, applicators 904A and 904N are configured to deposit gold, applicators 904B and 904Q are configured to deposit solder, applicators 904C and 904M are configured to deposit a dielectric material, applicators 904D and 904O are configured to deposit a conductive material, applicators 904E and 904P are configured to deposit liquid nitrogen, and applicators 904F and 904K are configured to deposit a conductive adhesive material. Redundancies protect against applicator assembly failure.

Although depositing different materials, applicators 904 may be substantially identical in structure. Applicators 904 may also be configured to deposit different quantities of material. For example, applicators 904C and 904M may be configured to deposit a high volume of dielectric material, while applicators 904G and 904L may be configured to deposit dielectric material in precise quantities.

Figure 10:
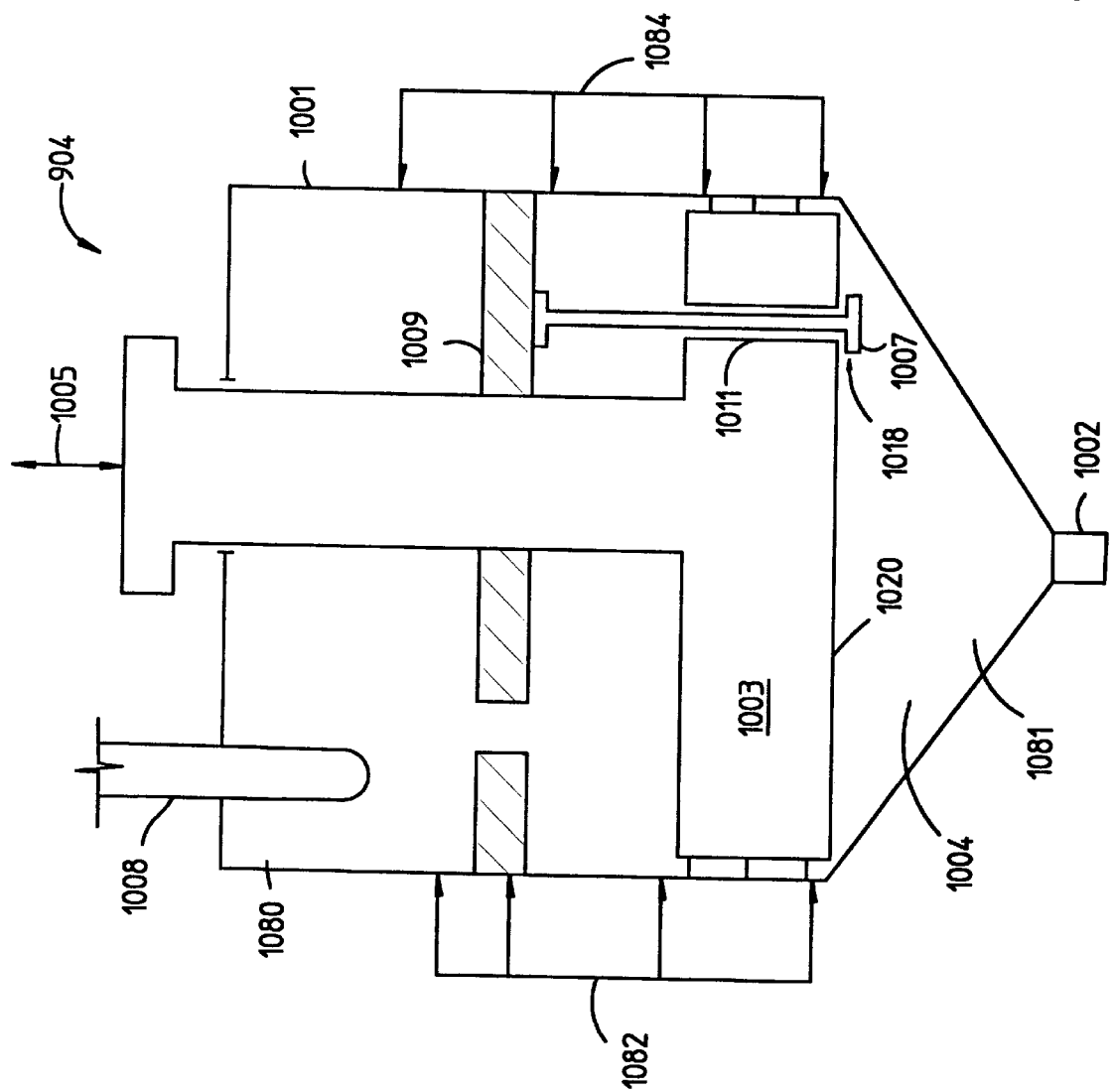
FIG. 10 is a detailed view of a material applicator of the invention.

FIG. 10 shows a preferred embodiment of material applicator 904. Material applicator 904 includes a shell 1001, a snout or nozzle 1002, a reservoir 1004 and heat sources 1082,1084. A material 1008 is fed from material delivery support system 706 as a wire to each applicator 904. Material delivery support system 706 provides a metered amount of material to applicator 904 under control of fabrication controller 134.

Material 1008 enters an upper chamber 1080 of reservoir 1004 as a solid wire and is heated by heat sources 1082,1084 (e.g., electric ohmic heating or laser heating) to a molten or liquid state. Once melted, material 1008 moves by gravity and/or other means through a central, stationary baffle plate 1009 and accumulates above a piston 1003. When the applicator 904 is not required to deposit material 1008, piston 1003 remains in a retracted position that allows molten material to flow through a hole 1011 and into a lower chamber 1081 of reservoir 1004. A valve 1007 controls material flow through hole 1011. One end of the stem of valve 1007 is coupled to baffle plate 1009. The head of valve 1007 is disposed a small distance from the surface of piston 1003. This allows molten material to flow through hole 1011 when piston 1003 is in the retracted position.

When applicator 904 is called upon by fabrication controller 134 to deliver an increment of material, a push/pull actuator 1005 (illustrated as an arrow) pushes the piston 1003 down a predetermined distance. On the downward stroke valve 1007 seats against the bottom 1020 of piston 1003 and closes opening 1011. The downward force of piston 1003 then causes an increment of material in chamber 1081 to be forced out of snout 1002 into a shaping device (not shown in FIG. 10, see FIGS. 11 and 12). Actuator 1005 then retracts piston 1003 and then waits/prepares for a next deposit cycle.

Figure 11:
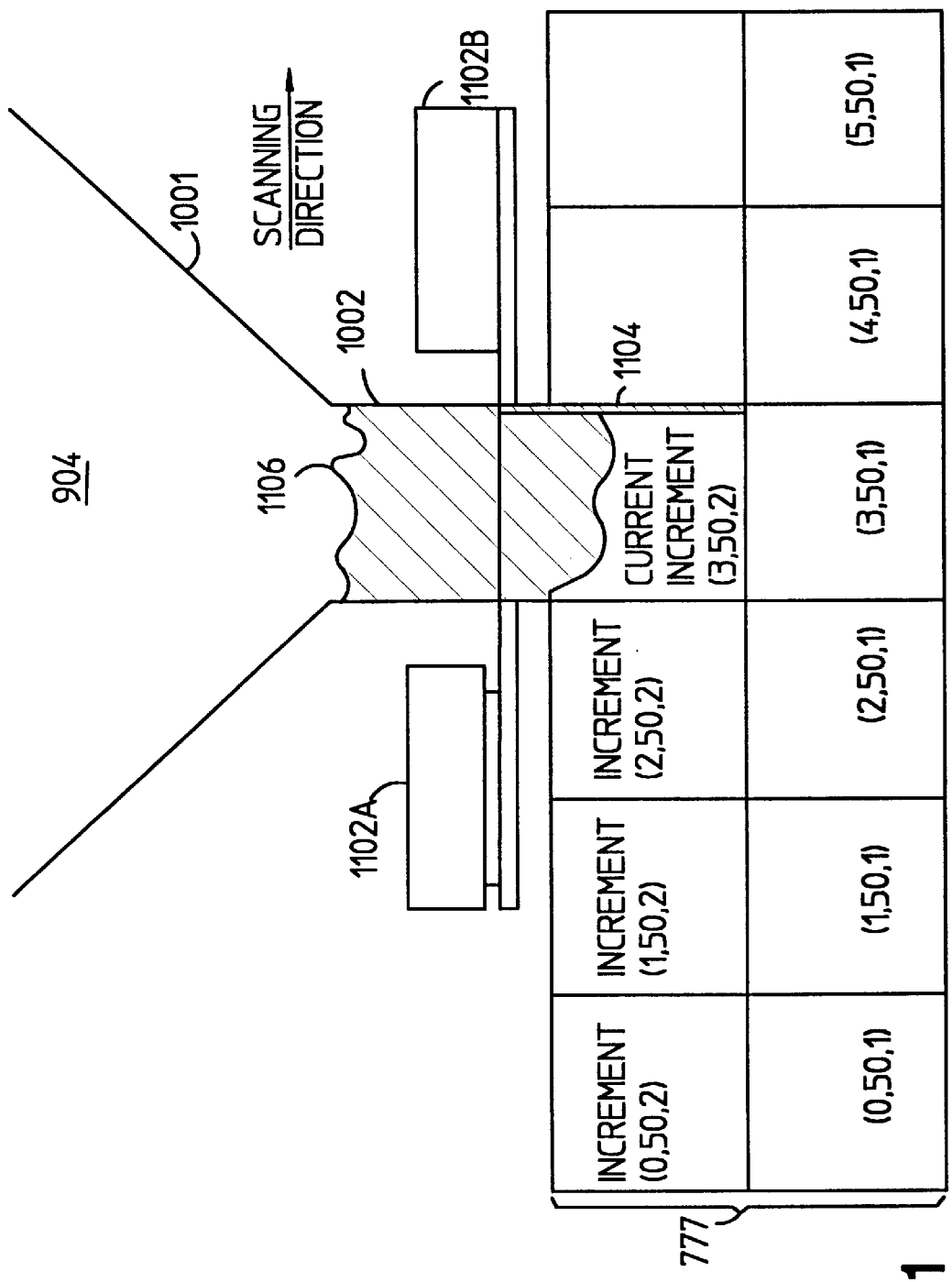
FIG. 11 illustrates operation of the material applicator of FIG. 10 in depositing an increment of fabrication material.

FIG. 11 is a side view of material delivery snout or nozzle 1002. Snout 1002 includes electromagnets 1102A, 1102B and a T-shaped guide 1104. T-shaped guide 1104 operates to contain and shape an increment of material after it has been deposited and while it solidifies (at least partially). Electromagnets 1102A and 1102B are disposed at opposite sides of snout 1002 and act to magnetically move T-shaped guide 1104 at the end of each row of increments deposited by applicator 904. An example of the operation of electromagnets 1102 and T-shaped guide 1104 in depositing and shaping an increment is now provided with reference to FIGS. 11 and 12.

FIG. 11 shows the building of a second slice (i.e., z=2) of a circuit board on top of a first slice (i.e., z=1). Applicator 904 is shown scanning in an x direction. For discussion, it is assumed that the fiftieth row (i.e., y=50) of the second slice is illustrated. Therefore, the current deposit address is (3,50,2). Example addresses for the other illustrated increments are also shown.

Molten material 1106 is ejected from snout 1002 of applicator 904 on command from fabrication controller 134. T-shaped guide 1104 contains the molten material 1106 in the current address location (e.g., 3,50,2) of matrix 400. In the case illustrated, T-shaped guide 1104 is positioned to the side of snout 1102 adjacent magnet 1102B and operates to contain the increment of material on the +x and the +y sides of the current increment position (e.g., 3,50,2). The previously deposited increments at (2,50,2) and (3,49,2) enclose the other two sides of the current increment position.

In order to scan in the opposite direction from that illustrated (i.e., in the −x direction), T-shaped guide 1104 must be moved to the side of snout 1102 adjacent magnet 1102A. This is accomplished by energizing electromagnet 1102A to magnetically attract T-shaped guide 1104. By changing the position of T-shaped guide 1104 at the completion of each scan row, bi-directional scanning of applicator 904 may be achieved.

Figure 12:
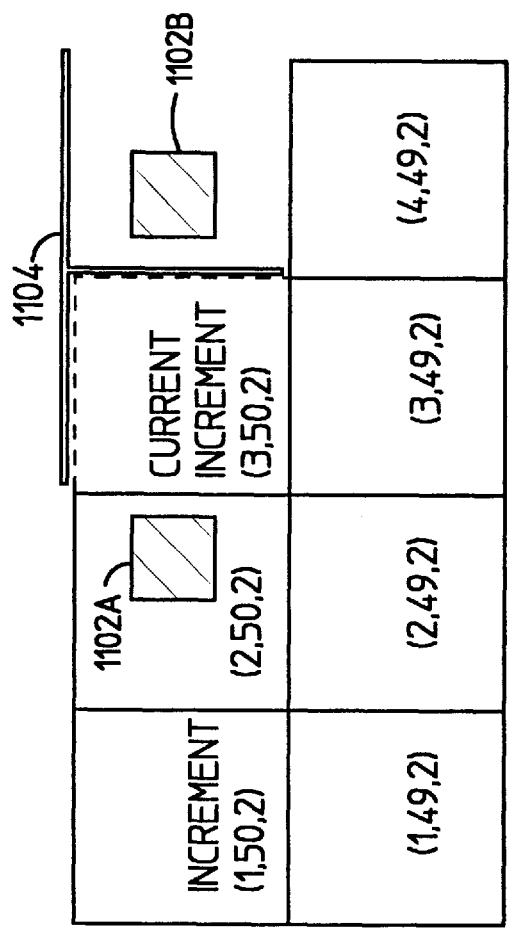
FIG. 12 illustrates positioning of an increment of fabrication material by the material applicator of FIGS. 10 and 11.

FIG. 12 is a top view showing the spatial relationship between electromagnets 1102, T-shaped guide 1104 and matrix address (3,50,2). Electromagnets 1102 are positioned above T-shaped guide 1104 as illustrated in FIG. 11. T-shaped guide 1104 acts to seal the open sides of the current matrix address (e.g., 3,50,2). As illustrated in FIG. 12, address (3,50,2) is bordered on two sides by previously deposited increments at addresses (2,50,2) and (3,49,2). T-shaped guide 1104 provides a border at the two remaining open sides to prevent a molten, deposited material from losing its cubic shape while solidifying. To accomplish this, T-shaped guide 1104 is attached to snout 1002 and extends downward therefrom for the depth of an increment (e.g., a few mils in the z direction).

T-shaped guide 1104 is made from a material which is incompatible with and will not readily bond to the fabrication materials being deposited by applicator 904. Also, T-shaped guide 1104 is formed in a T-shape rather than a single right-angle shape. This allows T-shaped guide 1104 to be used as applicator 904 scans in either an x or a minus x direction.

Snout 1002 may be formed in a variety of different shapes. For example, by providing snout 1001 with a square inner bore, the formation of cubed-shaped increments is facilitated.

While the discussion set forth above has addressed the deposition of solid materials, it should be understood that materials in the liquid and gas states may also be deposited by applicator assembly 904. For example, liquid nitrogen may be deposited as a null material. An applicator for dispensing increments of liquid nitrogen need not have a means for heating and melting the material and will therefore be of a simpler design.

Incremental deposition of materials according to the invention allows intricate features to be formed either above or below the upper surface of the circuit board. However, it would be difficult to form an irregular surface on the lower face of a circuit board which lies against fabrication base 712. Because of the building block fashion in which a circuit board is constructed, large voids may not be left on fabrication base 712 because upper layers must be stacked upon these lower layers. To solve this problem and to allow formation of an irregular surface, fabrication base 712 is not a static flat surface. Rather, fabrication base 712 is a dynamic surface which may be contoured to a desired pattern.

Figure 13:
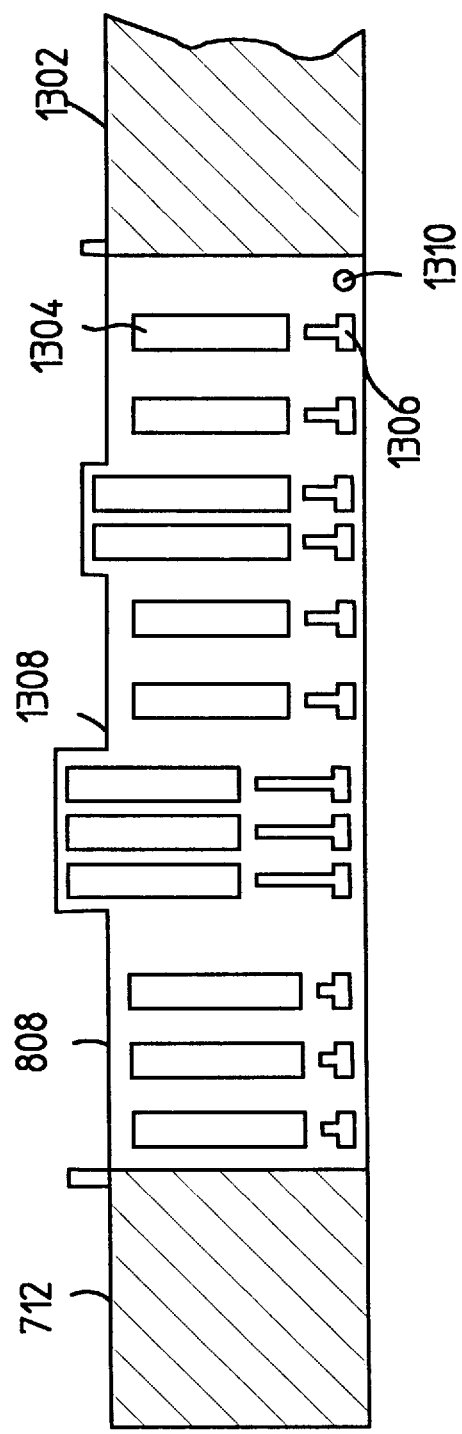
FIG. 13 is a cross-sectional view of the fabrication base of the invention.

Referring to the cross-sectional view of FIG. 13, fabrication base 712 is described in greater detail. Base 712 defines a central scanning field 808 and a stable perimeter region 1302. Perimeter region 1302 may be formed, for example, from a graphite reinforced composite material with a polished surface. Scanning field 808 is an integrated grid of metal alloy blocks 1304, each approximately 5 to 25 mils square, spaced 1 to 5 mils apart in the x,y plane. This array of blocks 1304 covers the entire area of scanning field 808. Blocks 1304 are configured to move up and down above or below the surface of perimeter region 1302. Each block 1304 is coupled to a pneumatic or hydraulic piston 1306 which controls its height.

Blocks 1304 in scanning field 808 are covered by a metal alloy sheet or foil 1308. After setting the desired height of the blocks 1404 (also done by controller 134), a vacuum is applied to the space beneath foil 1308 via port 1310. The vacuum causes foil 1408 to fit the shape of blocks 1304. This makes it possible to form features of a circuit board which are either above or below the lower face of the board. Configuration of the base (i.e., blocks 1304) occurs during set-up of the fabrication cabinet, preferably performed prior to step 304 of FIG. 3.

Figure 14A:
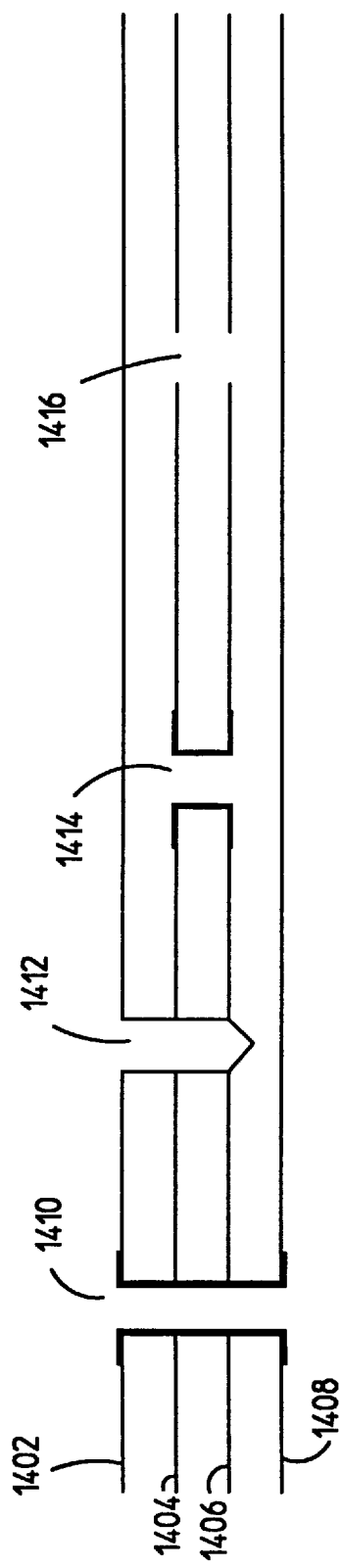
FIG. 14A is a cross-sectional view of a conventional circuit board illustrating the implementation of a through hole, a blind via, and a buried via.

FIG. 14A illustrates a cross-section of a conventional circuit board having four conductive layers 1402, 1404, 1406 and 1408. A conventional via or plated through hole 1410 is shown connecting all of conductive layer 1402–1408. Similarly, a blind via 1412 is shown connecting layers 1402–1406. A buried via 1414 is shown connecting conductive layers 1404 and 1406. Each of vias 1410, 1412 and 1414 may be formed using conventional printed circuit board fabrication techniques. Conventional techniques are able to create these various vias because the vias are perpendicular to the plane of the circuit board. This allows the holes for the vias to be formed by drilling. Note, however, that it is not possible to connect layers 1402 and 1406 at the position indicated by reference number 1416 using conventional techniques because a perpendicular via which contacts layer 1406 will also contact layer 1404.

Incremental circuit board fabrication according to the invention is able to create vias, blind vias and buried vias. In addition, however, because the invention is not limited by the printing, layering and drilling processes of conventional techniques, angular vias are possible. This is illustrated in FIG. 14B.

Figure 14B:
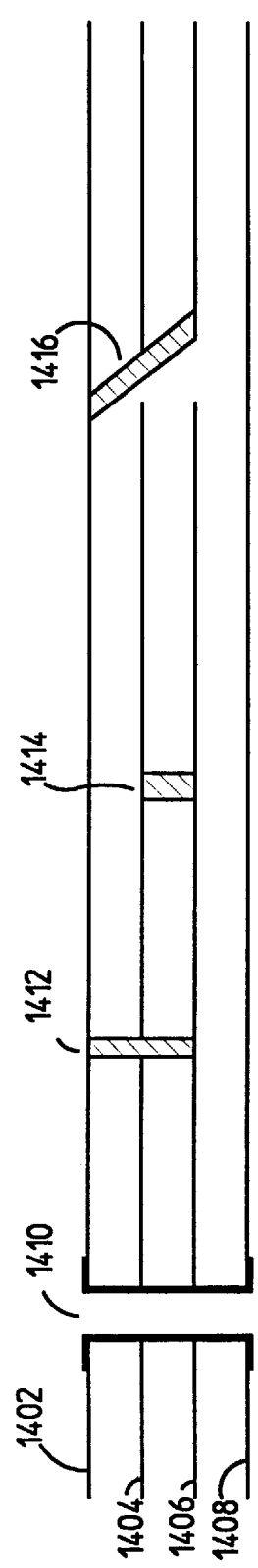
FIG. 14B is a cross-sectional view of a circuit board built in accordance with the present invention illustrating the implementation of a through hole, a blind via, a buried via and an angular via.

FIG. 14B illustrates a cross-section of a circuit board formed in accordance with the invention. Note the four conductive layers 1402, 1404, 1406 and 1408. As in FIG. 14A, a plated through hole 1410 is shown connecting all of conductive layer 1402–1408. A blind via 1412 is shown connecting layers 1402–1406. Note that via 1414 is implemented as a solid column of conductive material. A buried via 1414, shown connecting conductive layers 1404 and 1406, is also implemented as a solid column of conductive material.

An angular via 1416 is shown connecting layers 1402 and 1406. Note that the angular via is like a buried or blind via but can be used to connect conductive layers in places where a perpendicular via could not be used. For example, angular via 1416 connects conductive features of layers 1402 and 1406 while navigating past conductive features of interim layer 1404. Such an angular via is easily manufactured in accordance with the present invention. Angular vias such as this, however, are not possible using conventional printed circuit board fabrication techniques. Moreover, the invention is not limited to linear vias. Vias may be formed in any configuration or shape.

The preferred embodiment of the invention has been described as using raw materials supplied in a wire or ribbon format. Other raw material formats, however, may be used. For example, the raw fabrication materials may be supplied in a pellet form. The use of raw material pellets would require modifications to raw material supply system 136, raw material queue 704, material delivery support system 706, and applicator assembly 710.

In another embodiment, the invention may be used to build discrete components (e.g., resistors, capacitors, inductors) as integral parts of the circuit board. For example, a high resistance conductive material may be deposited to form a resistor. To form a capacitor, a high dielectric constant material may be deposited between two conductive plates. To form an inductor, a conductive material may be deposited into a helical shape.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

I claim:

1. A computer-based method for depositing material onto a fabrication base to form a circuit board, the method carried out prior to insertion of pre-fabricated components into the circuit board, the method comprising the steps of:
    (a) receiving design data representing a layout of the circuit board;
    (b) transforming said design data into a three-dimensional matrix of increments, each increment being identified within said matrix by an address and being assigned a raw fabrication material selected from a plurality of such raw fabrication materials; and
    (c) depositing said assigned raw fabrication materials onto the fabrication base in an incremental three-dimensional fashion as indicated by said matrix to thereby three-dimensionally form the circuit board so that it is suitable for subsequent insertion of pre-fabricated components.

2. The computer-based method of claim 1, wherein step (b) comprises the steps of:
    (1) calculating an increment size based on design features of the circuit board;
    (2) generating a generic matrix of increments approximately representing physical dimensions of the circuit board;
    (3) removing increments from selected locations of said generic matrix to form cut-out features of the circuit board;
    (4) adding increments to selected locations of said generic matrix to form protruding features of the circuit board; and
    (5) assigning a fabrication material to each increment in said generic matrix.

3. The computer-based method of claim 2, wherein step (b)(5) comprises the steps of:
    (i) assigning a conductor fabrication material to each increment in said generic matrix that is designated as a conductor by said design data;
    (ii) assigning a null material to each increment in said generic matrix that is designated as an open space by said design data; and
    (iii) assigning a dielectric material to each increment in said generic matrix not assigned a fabrication material in one of steps (b)(4)(i) and (b)(4)(ii).

4. The computer-based method of claim 1, wherein step (c) comprises the steps of:
    (1) positioning an applicator assembly to a starting position above said fabrication base, said starting position corresponding to an address of a first increment in a first layer of said matrix representing the circuit board;
    (2) depositing a fabrication material assigned to said first increment on said fabrication base at a position corresponding to said address of said first increment;
    (3) positioning said applicator assembly to a next position corresponding to an address of an adjacent increment;
    (4) depositing a fabrication material assigned to said adjacent increment on said fabrication base at a position corresponding to said address of said adjacent increment;
    (5) repeating steps (c)(3)–(c)(4) for each increment in said first layer of said matrix representing the circuit board;
    (6) positioning said applicator assembly to a next layer of said matrix above said first layer;
    (7) repeating steps (c)(1)–(c)(5) for said next layer of said matrix; and
    (8) repeating steps (c)(6)–(c)(7) for each remaining layer of the circuit board.

5. The computer-based method of claim 1, further comprising:
    (d) inserting pre-fabricated components into the circuit board.

6. The computer-based method of claim 1, wherein step (c) comprises:
    (1) depositing said assigned raw fabrication materials to integrally form discrete components in the circuit board.

7. The computer-based method of claim 1, wherein said assigned raw fabrication materials comprise conductive raw materials, dielectric raw materials, and null raw materials.

8. A computer-based system for depositing material onto a fabrication site to form a circuit board suitable for subsequent insertion of pre-fabricated components comprising:
    transformation means for receiving data specifying design requirements of the circuit board and for generating, from said data, a three-dimensional matrix of increments, each increment being identified within said matrix by an address and being assigned a raw fabrication material selected from a plurality of such raw fabrication materials;
    base means for providing the fabrication site for the circuit board; and
    fabrication means for depositing said assigned raw fabrication materials on said base means in an incremental three-dimensional fashion as indicated by said matrix to thereby three-dimensionally form the circuit board so that it is suitable for subsequent insertion of pre-fabricated components.

9. The computer-based system of claim 8, wherein said fabrication means comprises:
    raw material supply means for receiving fabrication materials to be used in the fabrication of the circuit board;
    applicator means for receiving said fabrication materials from said raw material supply means and for depositing incremental quantities of said fabrication materials on said base means;
    positioning means for positioning said applicator means relative to said base means; and
    control means for controlling said applicator means and said positioning means to build the circuit board in accordance with said matrix.

10. The computer-based system of claim 9, wherein said transformation means comprises a general purpose computer.

11. An apparatus for depositing material onto a fabrication base to form a circuit board suitable for subsequent insertion of pre-fabricated components, comprising:
    a fabrication cabinet having
        an applicator assembly configured to receive a plurality of raw fabrication materials and to deposit a three-dimensional array of incremental amounts of said plurality of raw fabrication materials onto said fabrication base, and
        a positioning system configured to position said applicator assembly relative to said fabrication base; and a fabrication controller configured to control said applicator assembly and said positioning system, wherein said fabrication controller uses a three-dimensional matrix of increments, each increment being identified within said matrix by an address and being assigned a raw fabrication material selected from said plurality of raw fabrication materials.

12. The apparatus of claim 11, wherein said fabrication cabinet further comprises:

a material supply system containing said plurality of fabrication materials;

a material queue configured to receive and store predetermined amounts of said plurality of fabrication materials; and a material delivery support system arranged to receive said plurality of fabrication materials from said material queue and to provide said plurality of fabrication materials to said applicator assembly.

13. The apparatus of claim 12, wherein said fabrication cabinet further comprises:

a shuttle assembly configured and arranged to remove the circuit board from said fabrication base upon completion of fabrication.

14. The apparatus of claim 13, wherein said fabrication cabinet further comprises:

an accumulator arranged to receive the circuit board from said shuttle assembly.

15. The apparatus of claim 14, wherein said fabrication cabinet further comprises:

an elevator assembly arranged to receive the circuit board from said accumulator and to remove the circuit board from said fabrication cabinet.

16. A computer-based method for fabricating a circuit board, comprising the steps of:

(a) receiving design data representing a layout of the circuit board;

(b) transforming said design data in a three-dimensional matrix of increments, each increment being identified with said matrix by an address and being assigned a fabrication material selected from a plurality of such fabrication materials, said transforming step comprising (1) calculating an increment size based on design features of the circuit board, (2) generating a generic matrix of increments approximately representing physical dimensions of the circuit board, (3) removing increments from selected locations of said generic matrix to form cut-out features of the circuit board, (4) adding increments to selected locations of said generic matrix to form protruding features of the circuit board, and (5) assigning a fabrication material to each increment in said generic matrix; and (c) depositing said assigned fabrication materials onto a fabrication base in an incremental fashion as indicated by said matrix to fabricate the circuit board.

17. A computer-based system for fabricating a circuit board, comprising:

transformation means for receiving data specifying design requirements of the circuit board and for generating, from said data, a three-dimensional matrix of increments, each increment being identified within said matrix by an address and being assigned a fabrication material selected from a plurality of such fabrication materials;

base means for providing a fabrication site for the circuit board; and fabrication means for depositing said assigned fabrication materials onto said base means in an incremental three-dimensional fashion as indicted by said matrix to thereby three-dimensionally fabricate the circuit board, said fabrication means comprising raw material supply means for receiving fabrication materials to be used in the fabrication of the circuit board, applicator means for receiving said fabrication materials from said raw material supply means and for depositing incremental quantities of said fabrication materials on said base means, positioning means for positioning said applicator means relative to said base means, and control means for controlling said applicator means and said positioning means to fabricate the circuit board in accordance with said matrix.

* * * * *